(12) United States Patent
Naka et al.

(10) Patent No.: US 7,057,278 B2
(45) Date of Patent: Jun. 6, 2006

(54) SEMICONDUCTOR DEVICE

(75) Inventors: Yasuhiro Naka, Tokyo (JP); Naotaka Tanaka, Tokyo (JP); Ikuo Yoshida, Tokyo (JP); Satoshi Imasu, Tokyo (JP); Takahiro Naito, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 101 days.

(21) Appl. No.: 10/741,637

(22) Filed: Dec. 18, 2003

(65) Prior Publication Data

US 2004/0140544 A1  Jul. 22, 2004

Related U.S. Application Data

(63) Continuation of application No. 10/093,639, filed on Mar. 7, 2002, now Pat. No. 6,727,583.

(30) Foreign Application Priority Data

Mar. 8, 2001 (JP) ............................. 2001-064316

(51) Int. Cl.
*H01L 23/34* (2006.01)
(52) U.S. Cl. ........................................ 257/723; 257/778
(58) Field of Classification Search ................ 257/724, 257/723, 664, 686
See application file for complete search history.

(56) References Cited

U.S. PATENT DOCUMENTS

| 5,308,980 | A | 5/1994 | Barton |
| 5,408,207 | A | 4/1995 | Chanteau |
| 5,869,894 | A | 2/1999 | Degani et al. |
| 6,100,113 | A | 8/2000 | Wang |
| 6,437,990 | B1 | 8/2002 | Degani et al. |
| 6,462,427 | B1 * | 10/2002 | Sakiyama et al. .......... 257/786 |
| 6,501,174 | B1 | 12/2002 | Semkow et al. |

FOREIGN PATENT DOCUMENTS

| JP | 11-220077 A | 8/1999 |
| JP | 2000-040775 A | 2/2000 |
| JP | 2000-236042 A | 8/2000 |

OTHER PUBLICATIONS

Lau et al. "TMA, DMA, DSC, and TGA of lead free solders," proceedings of the IEEE 48th Electronic Components and Technology Conference, pp. 1339-1344 (May 1998).

* cited by examiner

*Primary Examiner*—Roy Potter
(74) *Attorney, Agent, or Firm*—Townsend and Townsend and Crew LLP

(57) ABSTRACT

In a semiconductor device adapted to be mounted on a board and to be electrically connected to the board, comprising, at least two semiconductor electric chips, and a substrate on which the semiconductor electric chips are mounted and to which the semiconductor electric chips are electrically connected, in such a manner that the semiconductor electric chips are mounted on and electrically connected to the board through the substrate, according to the present invention, a thickness of each of the semiconductor electric chips in a direction in which the each of the semiconductor electric chips and the substrate are stacked is smaller than a thickness of the substrate in the direction.

21 Claims, 15 Drawing Sheets

FIG.3
| ANALYZED STRUCTURE | SEMICONDUCTOR ELEMENT CENTRAL PORTION MAXIMUM PRINCIPAL STRESS(MPa) | UNDERFILL OBLIQUE SARFACE END PORTION MAXIMUM PRINCIPAL STRESS(MPa) |
|---|---|---|
| 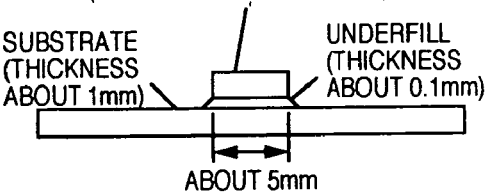 SEMICONDUCTOR ELEMENT (THICKNESS ABOUT 0.7mm) / SUBSTRATE (THICKNESS ABOUT 1mm) / UNDERFILL (THICKNESS ABOUT 0.1mm) / ABOUT 5mm | 107 | 180 |
| 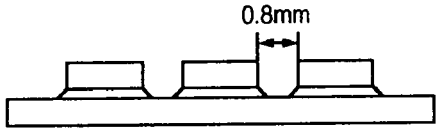 0.8mm <br> (LEMENT NUMBER 3, ELEMENT DISTANCE 0.8mm) | 109 | 183 |
| 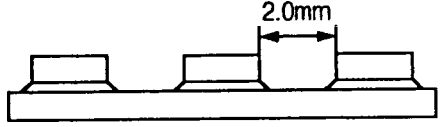 2.0mm <br> (LEMENT NUMBER 3, ELEMENT DISTANCE 2.0mm) | 109 | 183 |

FIG.7

| h(mm)＼l(mm) | 0.07 | 0.4325 | 0.795 |
|---|---|---|---|
| 0.07 | $\frac{165}{116}$ | $\frac{140}{116}$ | $\frac{138}{116}$ |
| 0.4325 | $\frac{59.6}{116}$ | $\frac{134}{116}$ | $\frac{146}{116}$ |
| 0.795 | $\frac{3.90}{116}$ | $\frac{9.11}{116}$ | $\frac{145}{116}$ |

$$\left( \frac{\text{PRINCIPAL STRESS AT SEMICONDUCTOR ELEMENT CENTRAL PORTION(MPa)}}{\text{PRINCIPAL STRESS AT UNDERFILL OBLIQUE SURFACE END PORTION(MPa)}} \right)$$

FIG.8

| UNDERFILL OBLIQUE SURFACE SHAPE | MAXIMUM PRINCIPAL STRESS AT SEMICONDUCTOR ELEMENT CENTRAL PORTION | MAXIMUM PRINCIPAL STRESS AT UNDERFILL OBLIQUE SURFACE END PORTION |
|---|---|---|
| ⟨UNIFORM SHAPE, OBLIQUE SURFACE END PORTION POSITION X⟩ | 117 | X)145 |
| ⟨UNIFORM SHAPE, OBLIQUE SURFACE END PORTION POSITION Y⟩ | 116 | Y)165 |
| ⟨NOT-UNIFORM SHAPE, BOTH OBLIQUE SURFACE END PORTION POSITIONS X AND Y⟩ | 116 | X)146<br>Y)165 |

FIG.9
| UNDERFILL OBLIQUE SURFACE SHAPE | MAXIMUM PRINCIPAL STRESS AT O SEMICONDUCTOR ELEMENT CENTRAL PORTION | MAXIMUM PRINCIPAL STRESS AT UNDERFILL OBLIQUE SURFACE END PORTION |
|---|---|---|
| 2.0mm 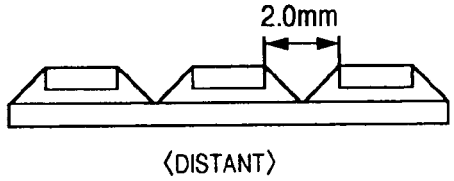 ⟨DISTANT⟩ | 113 | 152 |
| 0.8mm 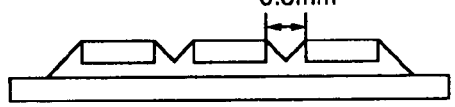 ⟨CONTINOUS⟩ | 113 | 152 |

SEMICONDUCTOR DEVICE

BACKGROUND OF THE INVENTION AND RELATED ART STATEMENT

The present invention relates to a semiconductor device, particularly to a multi-chips module (MCM) type semiconductor device adapted to be mounted on a board and to be electrically connected to the board.

JP-A-11-220077 discloses that a coefficient of thermal expansion and so forth is adjusted to restrain a crack of a semiconductor element and/or an under-fill in a flip-chip type semiconductor device. JP-A-2000-40775 discloses a shape of an oblique surface of the under-fill is adjusted to restrain the crack of the semiconductor element.

OBJECT AND SUMMARY OF THE INVENTION

An object of the present invention is to provide a semiconductor device in which an excessive stress, for example, an excessive thermal stress is restrained to maintain a reliability of the semiconductor device.

In a semiconductor device adapted to be mounted on a board and to be electrically connected to the board, comprising, at least two semiconductor electric chips, and a substrate on which the semiconductor electric chips are mounted and to which the semiconductor electric chips are electrically connected, in such a manner that the semiconductor electric chips are mounted on and electrically connected to the board through the substrate, according to the present invention, a thickness of each of the semiconductor electric chips in a direction in which the each of the semiconductor electric chips and the substrate are stacked is smaller than a thickness of the substrate in the direction.

Since the thickness of the each of the semiconductor electric chips in the direction in which the each of the semiconductor electric chips and the substrate are stacked is smaller than the thickness of the substrate in the direction, a bending rigidity of the each of the semiconductor electric chips is kept small while a bending rigidity of the substrate is kept great. Therefore, a stress in and on the each of the semiconductor electric chips is kept small when the semiconductor device is bent with a thermal deformation thereof and/or an external force applied to the semiconductor device.

When a Young's modulus of the semiconductor electric chips is larger than a Young's modulus of the substrate, it is more important that the bending rigidity of the each of the semiconductor electric chips is kept small, because, the greater the Young's modulus of the semiconductor electric chips is, the greater the stress in and on the each of the semiconductor electric chips is. When a linear expansion coefficient of the semiconductor electric chips is smaller than a linear expansion coefficient of the substrate, it is more important that the bending rigidity of the each of the semiconductor electric chips is kept small. The semiconductor electric chips may be distant away from each other in a direction perpendicular to the direction.

The semiconductor device may further comprise a synthetic resin layer connected to the each of the semiconductor electric chips and the substrate so that the each of the semiconductor electric chips is connected to the substrate through the synthetic resin layer. When the Young's modulus of the semiconductor electric chips is larger than a Young's modulus of the synthetic resin layer, it is more important that the bending rigidity of the each of the semiconductor electric chips is kept small, because, the greater the Young's modulus of the semiconductor electric chips is, the greater the stress in and on the each of the semiconductor electric chips is. When the linear expansion coefficient of the semiconductor electric chips is smaller than a linear expansion coefficient of the synthetic resin layer, it is more important that the bending rigidity of the each of the semiconductor electric chips is kept small. When the semiconductor device further comprises an electrically conductive member through which the each of the semiconductor electric chips is electrically connected to the substrate, it is preferable for reinforcing effectively the electrically conductive member that the electrically conductive member is surrounded by the synthetic resin layer. When the semiconductor device further comprises the electrically conductive member through which the each of the semiconductor electric chips is electrically connected to the substrate, and an electrically insulating layer including synthetic resin arranged between the synthetic resin layer and the semiconductor electric chips so that the synthetic resin layer is connected to the semiconductor electric chips through the electrically insulating layer and including a surface extending perpendicular to the direction, it is preferable for restraining the excessive stress on the electrically conductive member when the semiconductor device is bent that the electrically conductive member extends on the surface between the electrically insulating layer and the synthetic resin layer. It is preferable that a Young's modulus of the synthetic resin layer under DMA measuring is not more than 10 GPA, and a linear expansion coefficient of the synthetic resin layer under TMA measuring is not more than $35 \times 10^{-6} K^{-1}$.

When the semiconductor device further comprises a metallic member connected to the semiconductor electric chips, and an adhesive through which the metallic member connected to the semiconductor electric chips, it is preferable for restraining the excessive stress on the semiconductor electric chips that a Young's modulus of the adhesive is smaller than a Young's modulus of the semiconductor electric chips.

When the each of the semiconductor electric chips includes a first surface facing to the substrate and a second surface as a reverse surface with respect to the first surface, it is preferable for restraining a crack on the semiconductor electric chips that the second surface of at least one of the semiconductor electric chips is a grinder-finished surface, because a maximum principal stress is generated on the second surface when the semiconductor device is bent by the internal thermal deformation or the external force.

The thickness of the each of the semiconductor electric chips may be not more than 50% of the thickness of the substrate. It is more preferable that the thickness of the each of the semiconductor electric chips is not more than 30% of the thickness of the substrate. It is preferable that $12 < AS (\times 10^{-6} K^{-1}) \leq 20$ and $TC/TS \leq -0.04AS+1.1$ when a linear expansion coefficient of the substrate under TMA measuring is AS, and a thickness of the each of the semiconductor chips is TC and a thickness of the substrate is TS.

It is proved on the basis of theoretical calculations as follows that the present invention is effective in various cases. A thermal stress on and in the semiconductor electric chip in a temperature variation range between −55° C. and 125° C. was calculated by two-dimensional elasticity analysis of finite element method. FIG. 2 shows a model of a semiconductor device to be analyzed. Principal stresses at a point A (central position of reverse surface of semiconductor chip) and at a point B (upper end of oblique surface of under fill joining surface of semiconductor chip) are calculated as important values by which whether or not a crack occurs in the semiconductor device is judged. A size of finite element of the semiconductor electric chip is set at 0.1 mm×0.05 mm for the calculation, because the point B is a stress concentration point at which the stress has a singularity.

As shown in FIG. 3 showing a calculation result, the principal stresses at the point A and B do not changed significantly in accordance with a number of the semiconductor electric chips on the substrate and/or a distance between the semiconductor electric chips. As shown in FIG. 4 showing a calculation result, the principal stresses at the point A and B do not changed significantly in accordance with a width of the semiconductor electric chip. As shown in FIG. 5 showing a calculation result, the principal stresses at the point A and B do not changed significantly in accordance with a width of the substrate. FIG. 6 shows dimensions of the under fill oblique surface in the model of a semiconductor device to be analyzed. As shown in FIG. 7 showing a calculation result, the stress at the point A does not change in accordance with the shape of the under fill oblique surface, and the stress becomes the maximum value at the point B when the point B (upper end of under fill oblique surface) is formed at the lower end of the semiconductor electric chip and an angle between the under fill oblique surface and the upper surface of the substrate is 45 degrees (h=1). As shown in FIG. 8 showing a calculation result, the principal stresses at the point A and B do not changed significantly in accordance with a difference in shape between the under fill oblique surfaces. As shown in FIG. 9 showing a calculation result, the principal stresses at the point A and B do not changed significantly in accordance with whether or not the under fills under the semiconductor electric chips are connected to each other.

Therefore, the principal stress at the point B formed at the lower end of the semiconductor electric chip with the angle of 45 degrees between the under fill oblique surface and the upper surface of the substrate as the maximum value of the principal stress in the semiconductor device was calculated as follows, while a number of the semiconductor electric chip on the substrate is 1, a width of the semiconductor electric chip is about 7 mm, a width of the substrate is about 25 mm, the thickness of the semiconductor electric chip is changed, the thickness of the substrate is changed, the coefficient of linear expansion of the substrate is changed, the coefficient of linear expansion of the under fill is changed, the Young's modulus of the under fill is changed, the Young's modulus of the semiconductor electric chip is fixed to about 190 GPA as the average Young's modulus value of semiconductor materials such as silicon, the coefficient of linear expansion of the semiconductor electric chip is fixed to about $3 \times 10^{-6} K^{-1}$ as the average Young's modulus value of semiconductor materials such as silicon, and the Young's modulus of the substrate is fixed to about 20 GPA as the average Young's modulus value of resin substrate materials such as glass-epoxy. The stress in and on the semiconductor electric chip changes significantly in accordance with the coefficient of linear expansion of the substrate, but does not change significantly in accordance with the Young's modulus of the substrate.

As shown in FIG. 10a showing a principal stress calculation result at the point A, and FIG. 10b showing a principal stress calculation result at the point B, when a critical principal stress is a value of principal stress on the semiconductor chip at which value a crack occurs on the semiconductor chip in a cyclic temperature change test, the Young's modulus of the under fill is about 10 GPA, and the coefficient of linear expansion of the under fill is about $35 \times 10^{-6} K^{-1}$, the principal stress at the point A decreases abruptly in accordance with a decrease of a ratio of semiconductor chip thickness/substrate thickness when the ratio is less than 1, and the principal stress at the point B decreases abruptly in accordance with the decrease of the ratio of semiconductor chip thickness/substrate thickness.

As shown in FIG. 11a showing a principal stress calculation result at the point A, and FIG. 11b showing a principal stress calculation result at the point B, when the coefficient of linear expansion of the substrate is $15 \times 10^{-6} K^{-1}$, the Young's modulus of the under fill is changed between about 10 GPA and about 6 GPA of the Young's modulus of the usually used under fills, and the coefficient of linear expansion of the under fill is changed between about $35 \times 10^{-6} K^{-1}$ and about $30 \times 10^{-6} K^{-1}$ of the coefficient of linear expansion of the usually used under fills, the principal stress at the point A does not change significantly in accordance with the coefficient of linear expansion and Young's modulus of the under fill, and the principal stress at the point B decreases in accordance with the decreases of each of the coefficient of linear expansion and Young's modulus of the under fill.

It is understood from the principal stress calculation results as shown in FIGS. 10a, 10b, 11a and 11b that the smaller the thickness of the semiconductor chip is, the smaller the principal stress in the semiconductor device is, when the ratio of semiconductor chip thickness/substrate thickness when the ratio is less than 1. Further, it is preferable for each of the coefficient of linear expansion of the substrate, the coefficient of linear expansion of the under fill and the Young's modulus of the under fill to be as small as possible. In order to decrease the principal stress in the semiconductor device to less than the critical principal stress so that the crack in the semiconductor device is restrained from occurring, it is necessary that the thickness of the semiconductor chip is not more than 50% of the thickness of the substrate when the Young's modulus of the under fill is not more than about 10 GPA, the coefficient of linear expansion of the under fill is not more than about $35 \times 10^{-6} K^{-1}$, and the coefficient of linear expansion of the substrate is not more than about $20 \times 10^{-6} K^{-1}$, or it is necessary that the thickness of the semiconductor chip is not more than 30% of the thickness of the substrate when the Young's modulus of the under fill is not more than about 10 GPA, the coefficient of linear expansion of the under fill is not more than about $35 \times 10^{-6} K^{-1}$, and the coefficient of linear expansion of the substrate is not more than about $15 \times 10^{-6} K^{-1}$. For example, $12 < As (\times 10^{-6} K^{-1}) \leq 20$ and $TC/TS \leq -0.04 AS + 1.1$ when the linear expansion coefficient of the substrate is $AS(\times 10^{-6} K^{-1})$, and the thickness of the semiconductor chip is TC and the thickness of the substrate is TS.

Other objects, features and advantages of the invention will become apparent from the following description of the embodiments of the invention taken in conjunction with the accompanying drawings.

BRIEF DESCRIPTION OF THE DRAWINGS

FIG. 3 is a table showing a relationship among a semiconductor chip arrangement, a position in the semiconductor device, and a stress value.

FIG. 7 is a table showing a relationship between a oblique surface shape of the under-fill, the position in the semiconductor device, and the stress value.

FIG. 8 is a table showing another relationship between a oblique surface shape of the under-fill, the position in the semiconductor device, and the stress value.

FIG. 9 is a table showing another relationship between a oblique surface shape of the under-fill, the position in the semiconductor device, and the stress value.

DETAILED DESCRIPTION OF PREFERRED EMBODIMENTS

Figure 1:
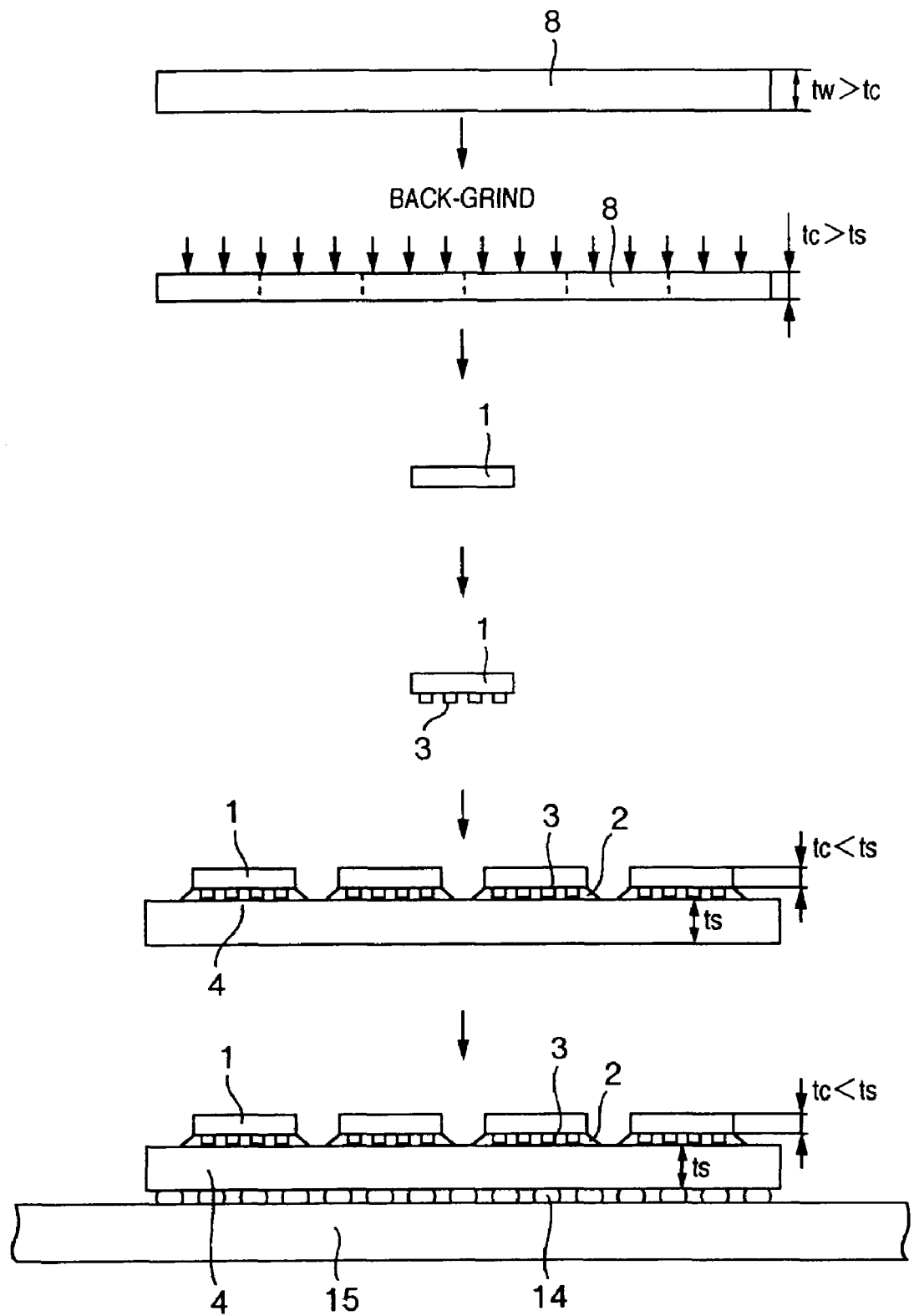
FIG. 1 is a combination of schematic side-views showing respective steps of a method for producing a semiconductor device of the invention.
Figure 2:
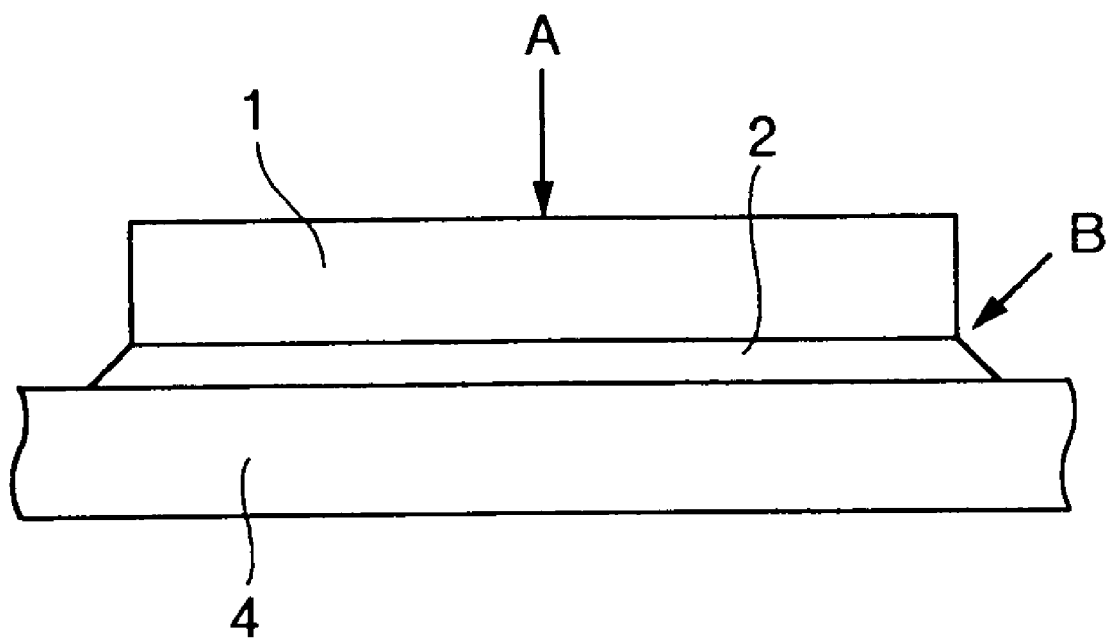
FIG. 2 is a side-view of a model of semiconductor device used to analyze a stress condition in accordance with a thermal deformation of the semiconductor device.
Figure 4:
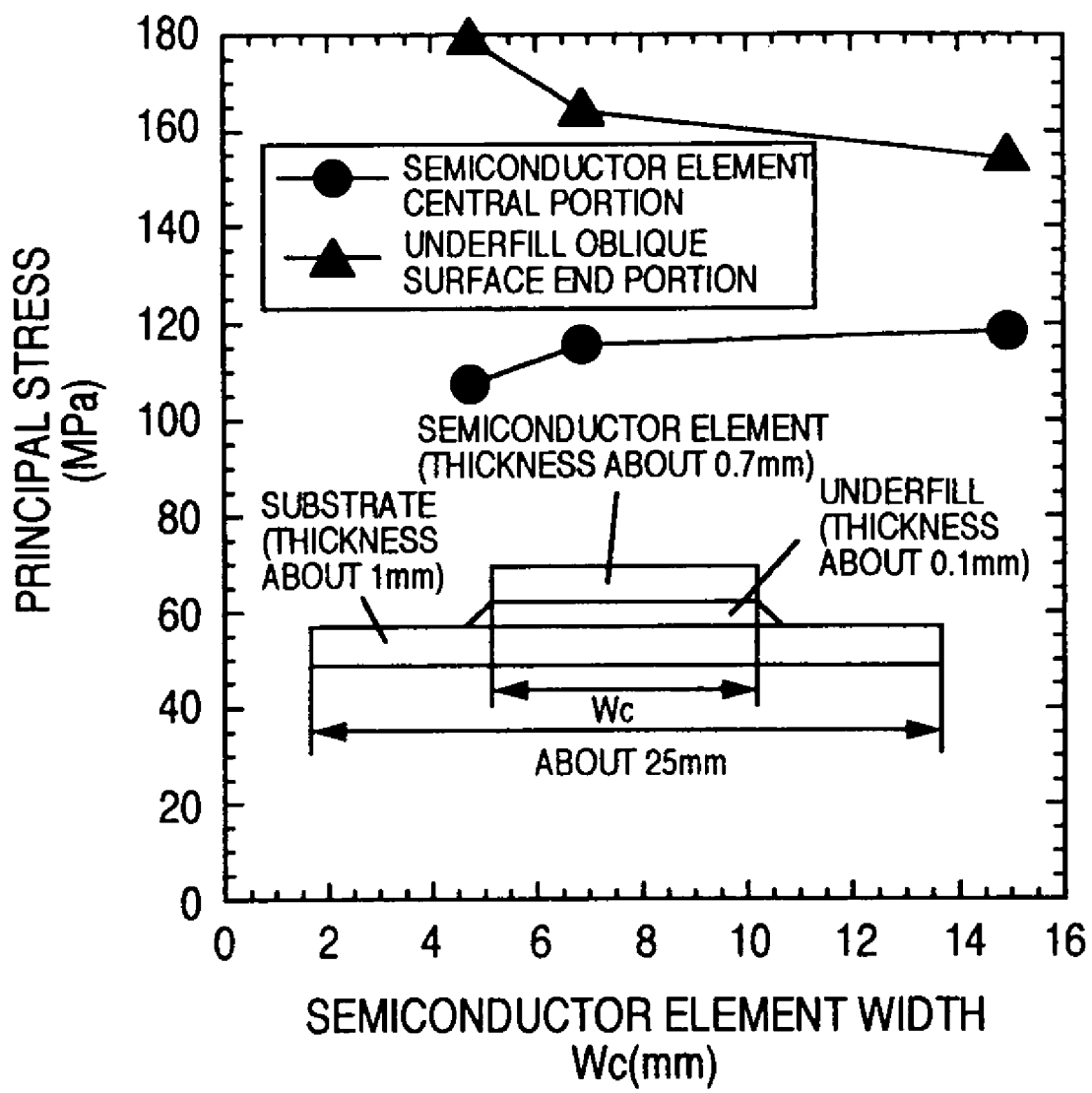
FIG. 4 is a diagram showing a relationship between a dimension of the semiconductor chip, the position in the semiconductor device, and the stress value.
Figure 5:
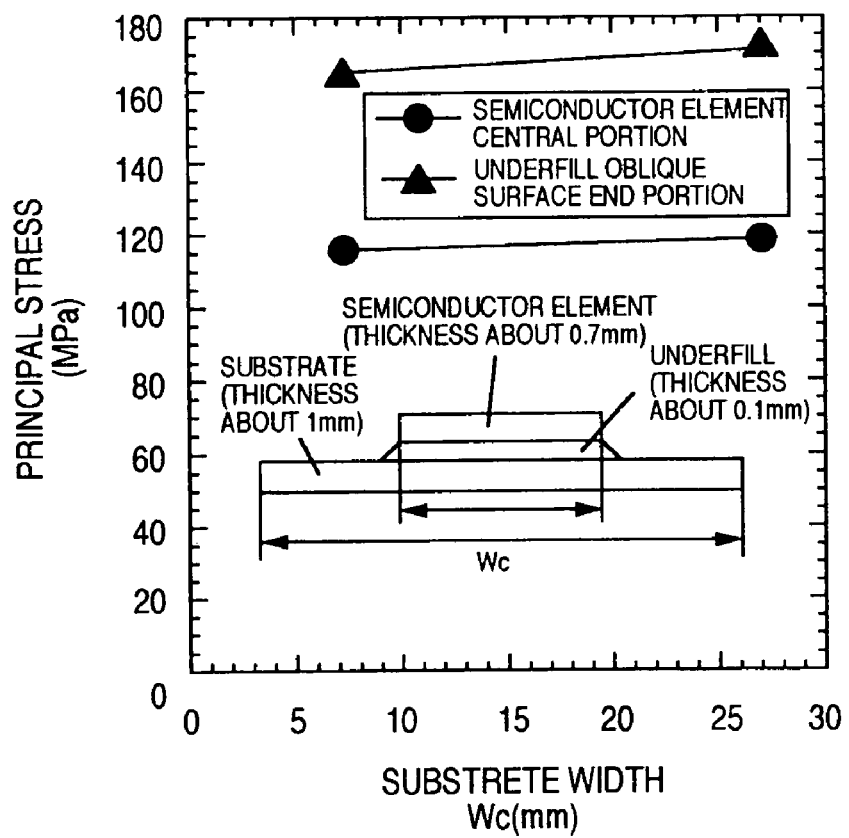
FIG. 5 is a diagram showing a relationship between a dimension of the semiconductor device, the position in the semiconductor device, and the stress value.
Figure 6:
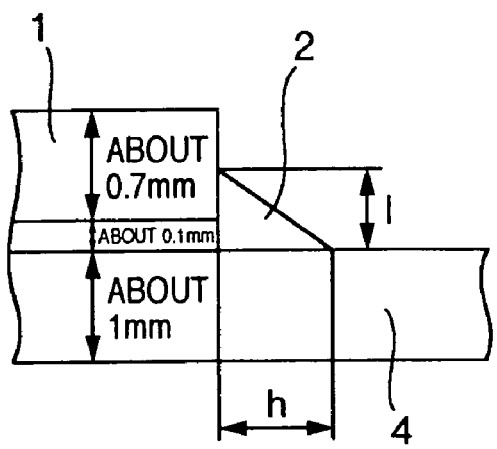
FIG. 6 is a side-view of a model of under-fill used to analyze a stress condition in accordance with a thermal deformation of the semiconductor device.
Figure 10A:
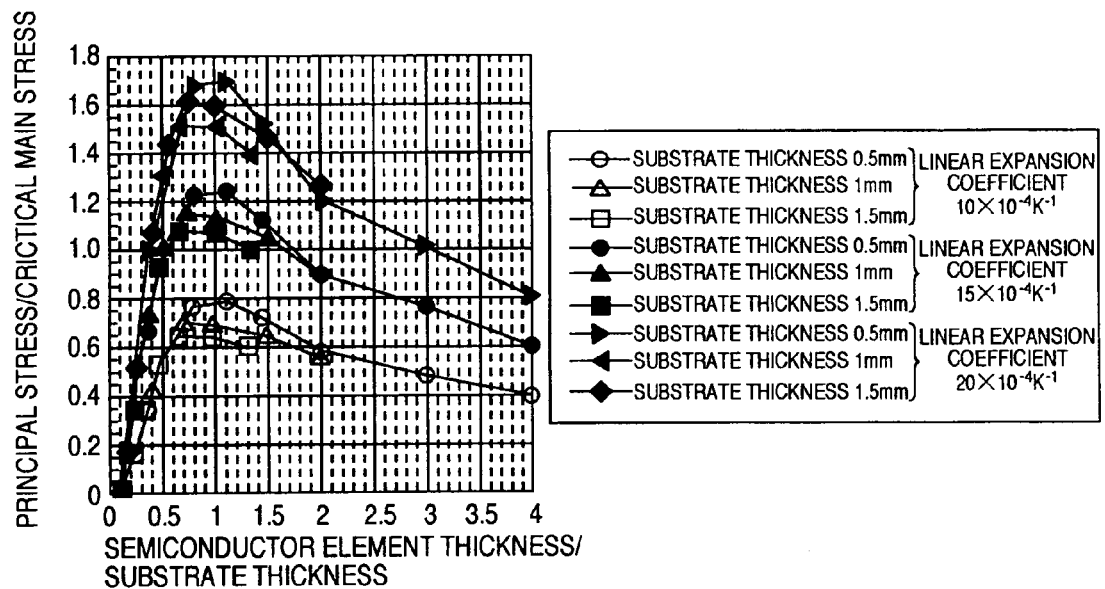
FIGS. 10a and 10b are diagrams each of which shows a relationship among a thickness of the substrate, a thickness of the semiconductor chip, a coefficient of linear expansion of the substrate, and the stress value.
Figure 10B:
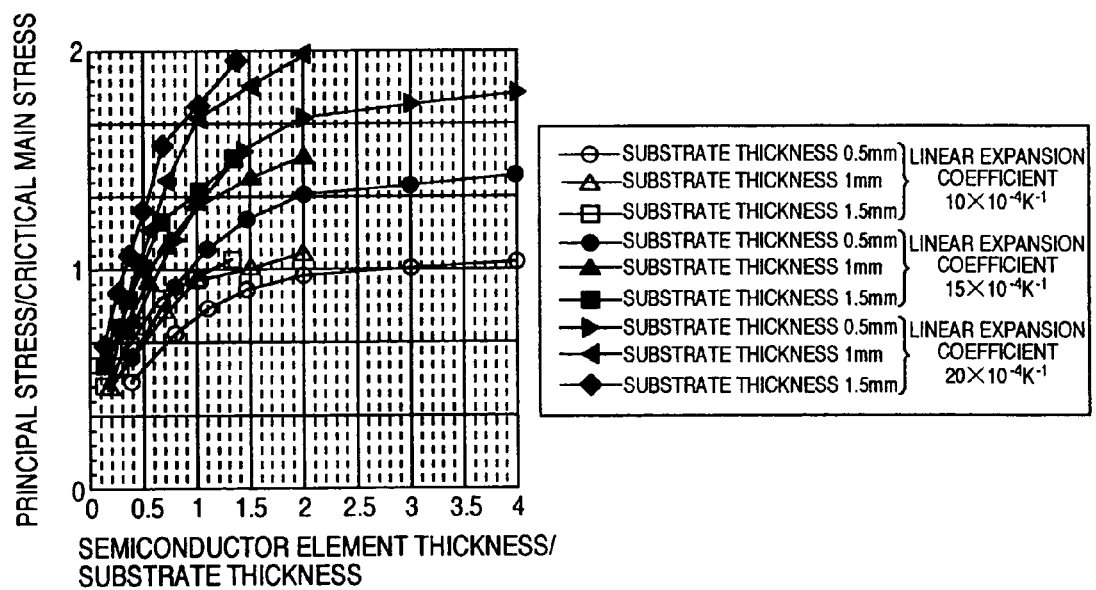
Figure 11A:
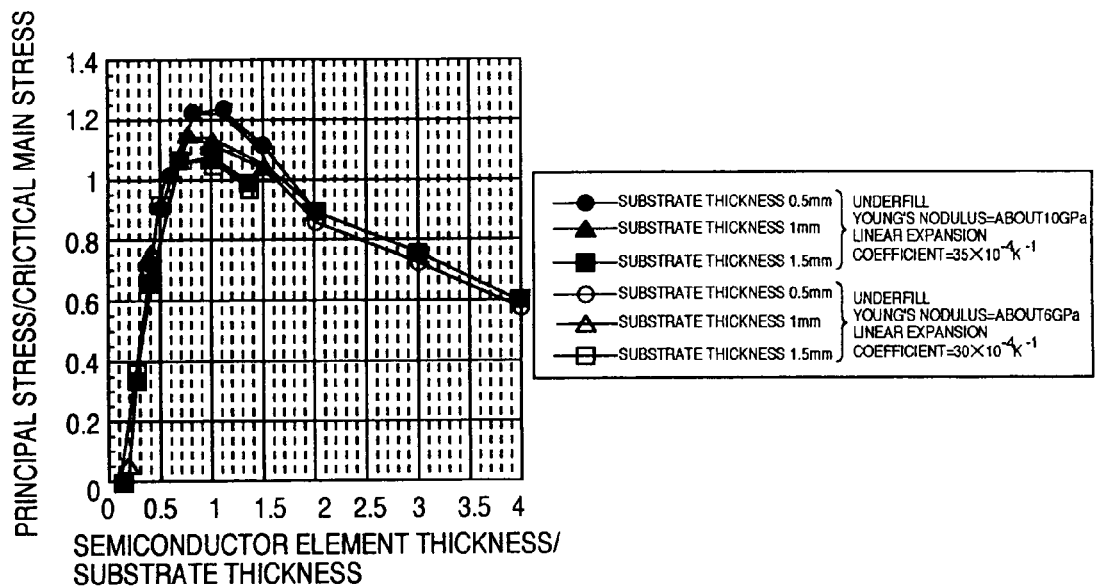
FIGS. 11a and 11b are diagrams each of which shows a relationship among a thickness of the substrate, a thickness of the semiconductor chip, a coefficient of linear expansion of the under-fill, a Young's modulus of the under-fill, and the stress value.
Figure 11B:
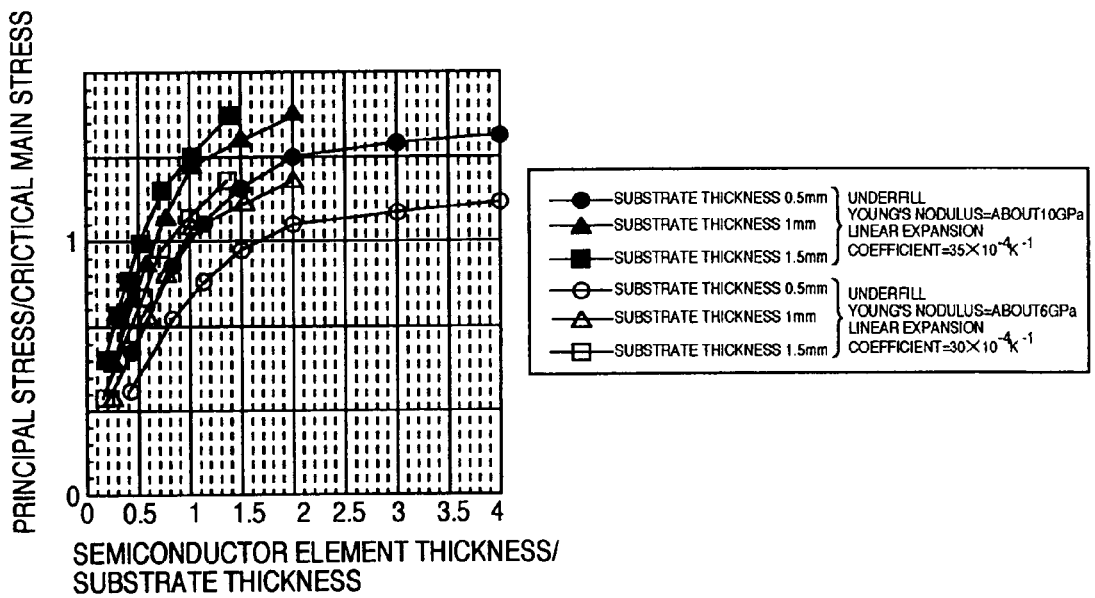

As shown in FIG. 1, when a MCM type semiconductor device is produced, a semiconductor, for example, silicon, wafer 8 of thickness TW (for example, about 0.75 mm) including electric circuits is ground on a reverse surface thereof to decrease the thickness TW to a thickness TC. The grinder-finished wafer 8 is diced to be divided to semiconductor electric chips 1 including respectively the electric circuits. Electrically conductive members such as bumps 3 of, for example, PB-SN solder, PB-free solder or AU are attached to each of the semiconductor electric chips 1. The semiconductor electric chips 1 are mounted onto a substrate 4 of organic resin. The thickness TC is smaller than a thickness TS of the substrate 4. The bumps 3 are heated to be welded to the substrate 4 so that the semiconductor electric chips 1 are electrically connected to the substrate 4. When the bumps 3 are made of AU, an ultra-sonic vibration is applied between the bumps 3 and the substrate 4 while pressing the bumps 3 against the substrate 4, so that the bumps 3 are welded to the substrate 4 to electrically connect the semiconductor electric chips 1 to the substrate 4. An organic resin, for example, epoxy resin is inserted into a space (of thickness, for example, 0.01–0.1 mm) between the semiconductor electric chips 1 and the substrate 4 and is cured therebetween so that under fills 2 reinforcing respective connections between the semiconductor electric chips 1 and the substrate 4 are formed. The substrate 4 includes bumps 14 for electrically connecting the substrate 4 to a mother board 15. The bumps 14 may be attached to the substrate 4 after the semiconductor electric chips 1 are mounted onto the substrate 4. The thickness TW may be decreased to the thickness TC by the grinder finishing after the wafer 8 is diced to be divided to semiconductor electric chips 1 or after the bumps 3 are attached to each of the semiconductor electric chips 1.

Figure 12:
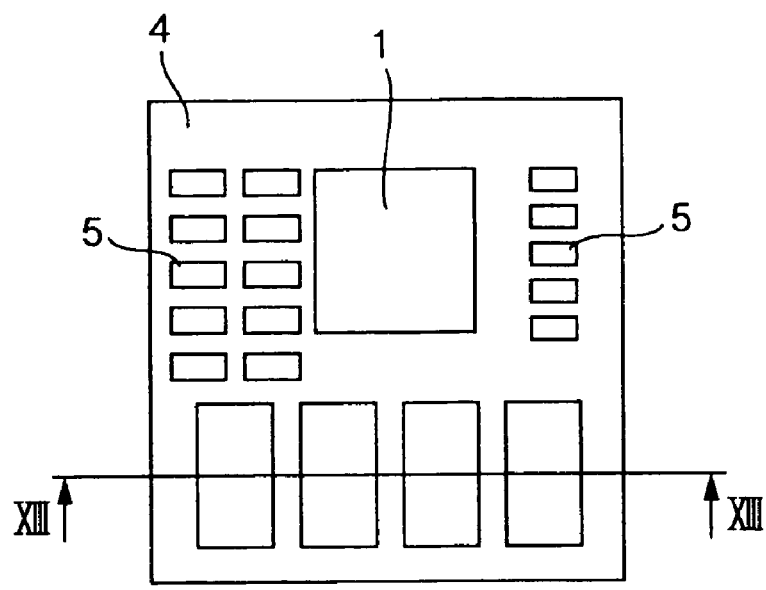
FIG. 12 is a schematic front view of another semiconductor device of the invention.

As shown in FIG. 12, on the substrate 4, various electric element 5 such as capacitors other than the semiconductor electric chips 1 may be also mounted. It is preferable for improving a reliability of the MCM type semiconductor device that a relationship between the thickness TC of the semiconductor electric chips 1 and the thickness TS of the substrate 4 is determined along the following formula.

$$TC/TS \leq -0.04 AS + 1.1 \ (12 < As \ (\times 10^{-6} K^{-1}) \leq 20)$$

Further, it is preferable that a coefficient of linear expansion of the substrate 4, a Young's modulus of the under fills and a coefficient of linear expansion of the under fills are respectively as small as possible. The coefficient of linear expansion of the substrate 4 is determined by measuring a coefficient of linear expansion of a part of the substrate 4 to be covered by the semiconductor electric chip 1 with TMA (thermomechanical analyzer). The coefficient of linear expansion of the under fills is determined by measuring a coefficient of linear expansion of a material resin of the under fills cured under the same condition as the under fills with TMA. The Young's modulus of the under fills is determined by measuring a Young's modulus of the material resin of the under fills cured under the same condition as the under fills with DMA (determination of dynamic mechanical property).

The PB-SN solder is used usually for the bumps, but a use of the PB-free solder for the bumps is accelerated by an environmental requirement. AU may be used to enable the bumps to have an extremely small distance between the bumps and an extremely small diameter of the bump. If a wiring of the device is formed by CU whose electrical characteristics are superior to those of Al, the bumps are made of CU. The substrate is made of a glass-epoxy resin whose coefficient of linear expansion (about $15 \times 10^{-6} K^{-1}$) is substantially equal to the coefficient of linear expansion of the mother board, so that a thermal stress between the substrate and the mother board is decreased to maintain an electrical connection reliability therebetween. In order to prevent a crack of the semiconductor electric chip caused by the thermal stress in accordance with a difference in coefficient of linear expansion between the semiconductor electric chip and the substrate, TC/TS is not more than 0.5, while TS is not more than 1 mm so that a size or thickness of the MCM type semiconductor device is kept small. The under fill reinforcing the connection between the substrate and the semiconductor electric chip may be formed by melting and curing a tape-shaped thermoplastic resin arranged between the substrate and the semiconductor electric chip together with a low-melting temperature solder for forming the bump. The under fill reinforcing the connection between the substrate and the semiconductor electric chip may be formed by melting and curing a tape-shaped thermoplastic and anisotropic electrically conductive resin (ACF) arranged between the substrate and the semiconductor electric chip together with AU for forming the bumps of extremely small distance therebetween.

The substrate may be made of a ceramic material whose coefficient of linear expansion (about $12 \times 10^{-6} K^{-1}$) is close to the coefficient of linear expansion (about $3 \times 10^{-6} K^{-1}$) of the semiconductor electric chip so that the thermal stress in the semiconductor electric chip is decreased to prevent the crack of the semiconductor electric chip. In this case, a difference between the coefficient of linear expansion of the substrate and a coefficient of linear expansion (about $15 \times 10^{-6} K^{-1}$) of the mother board is increased in comparison with a case in which the substrate is made of the glass-epoxy resin, so that an electrical connection reliability between the substrate and the mother board is decreased. Therefore, TC/TS is kept not more than 0.5 and TS is kept not more than 1 mm.

Figure 20:
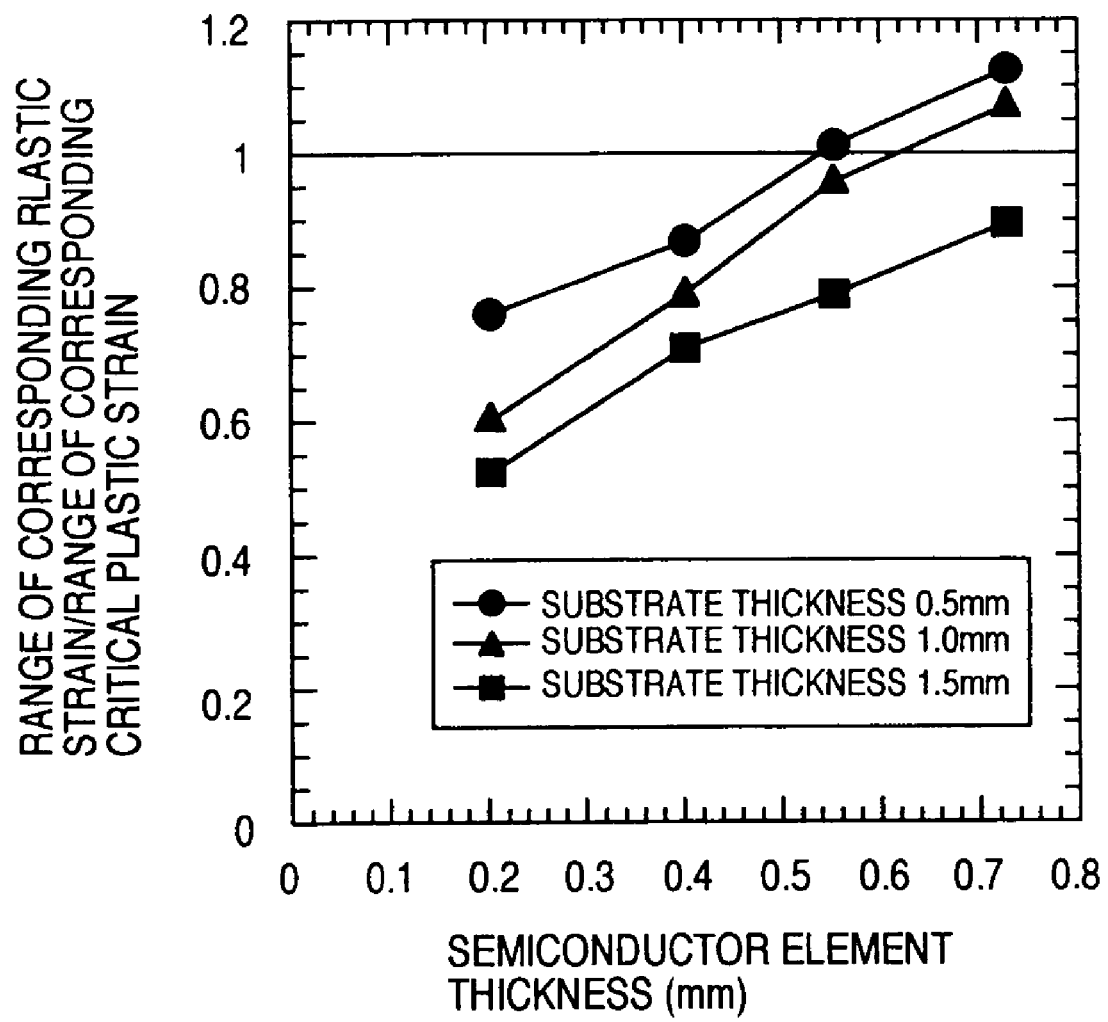
FIG. 20 is a diagram showing a relationship among a thickness of the substrate, a thickness of the semiconductor chip, and a strain on an electrically conductive member between the substrate and the semiconductor chip in a cyclic temperature variation.

The smaller the thickness of the semiconductor electric chip is, the higher the electrical connection reliability between the MCM type semiconductor device and the mother board is. As shown in FIG. 20 obtained when two semiconductor electric chips are mounted on the substrate whose coefficient of linear expansion is about $12 \times 10^{-6} K^{-1}$, the substrate is mounted on the board whose coefficient of linear expansion is about $15 \times 10^{-6} K^{-1}$, and a range of corresponding critical plastic strain is a critical value of a bump strength to be obtained, the smaller the thickness of the semiconductor electric chips is, the smaller a range of corresponding plastic strain is, that is, a reliability of the MCM type semiconductor device is increased, even when the thickness of the substrate varies. This result can be obtained even when the coefficients of linear expansions of the substrate and the mother board vary.

The strain of the bump or solder is caused by a difference in coefficient of linear expansion between the substrate and the mother board, a difference in coefficient of linear expansion between the semiconductor electric chip and the mother board and a difference in coefficient of linear expansion between the semiconductor electric chip and the substrate. The larger the difference in coefficient of linear expansion is and/or the larger a number of the semiconductor electric chips on the substrate is, the larger the strain of the bump or solder is. Therefore, it is preferable for the thickness of the semiconductor electric chip to be small in accordance with the difference in coefficient of linear expansion and/or the number of the semiconductor electric chips on the substrate. When the difference in coefficient of linear expansion between the substrate and the mother board is large, the greater the substrate is, the larger a sheering stress in the bump or solder is or the larger the strain of the bump or solder is. Therefore, it is preferable for the thickness of the semiconductor electric chip to be small in accordance with the size of the substrate.

Figure 13:
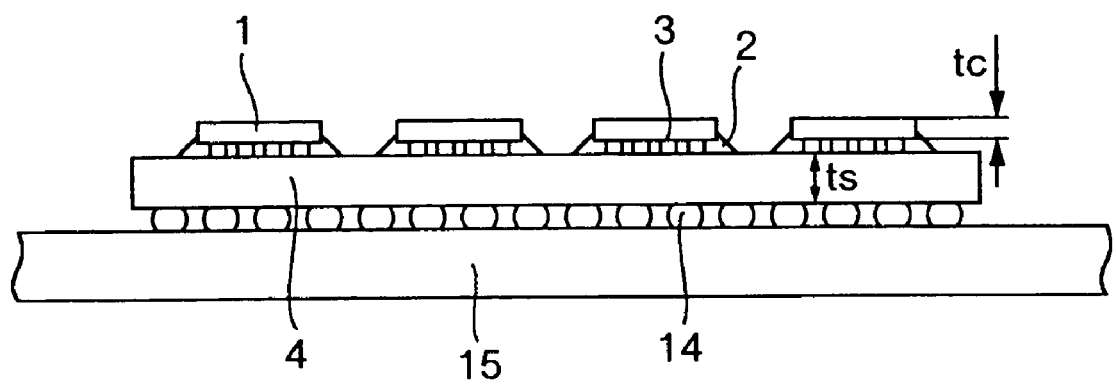
FIG. 13 is a side view of another semiconductor device of the invention.
Figure 14:
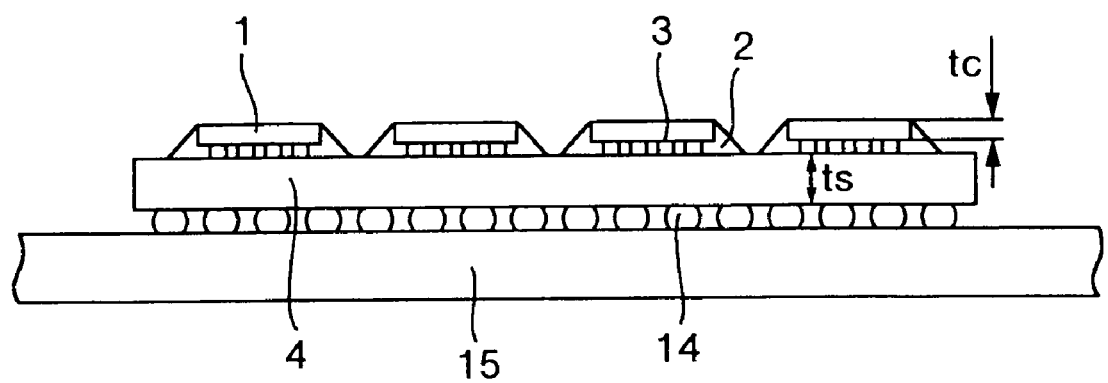
FIG. 14 is a side view of another semiconductor device of the invention.
Figure 15:
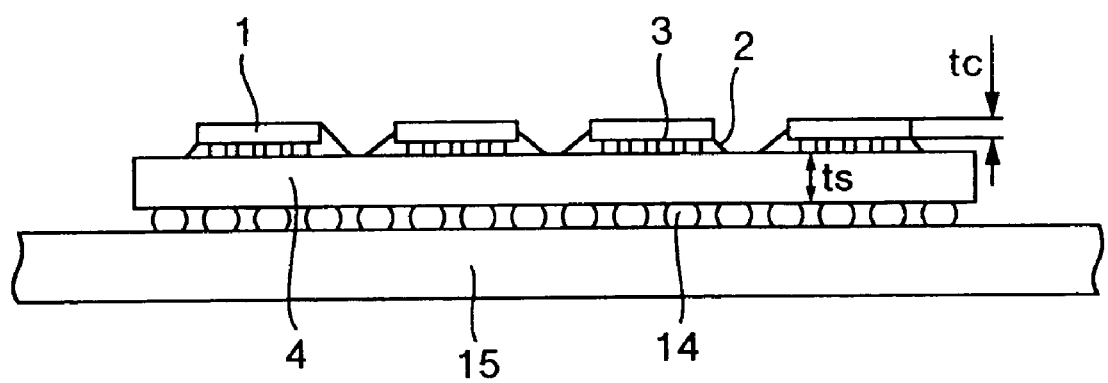
FIG. 15 is a side view of another semiconductor device of the invention.

The present invention is effective for various MCM type semiconductor devices as shown in, for example, FIGS. 13–19. As shown in FIGS. 13 and 15, a position at which an oblique surface end of the under fills 2 joins a side surface of the semiconductor electric chips 1 may be vary when the present invention is effective. Particularly, as shown in FIG. 15, the oblique surface end of the under fills 2 may join a lower end of the side surface of the semiconductor electric chips 1 when the present invention is effective. As shown in FIG. 14, the oblique surface end of the under fills 2 may join an upper end of the side surface of the semiconductor electric chips 1 when the present invention is effective. The present invention is effective even when a shape of the oblique surface of the under fills 2 varies.

Figure 16:
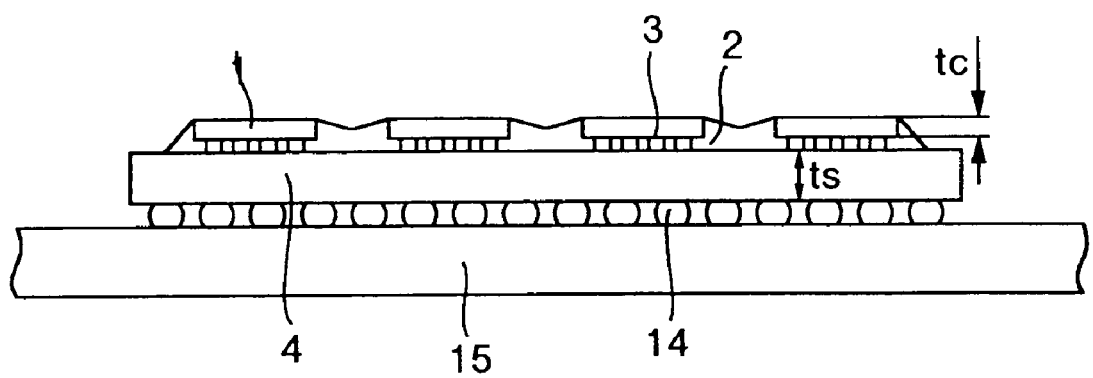
FIG. 16 is a side view of another semiconductor device of the invention.
Figure 17:
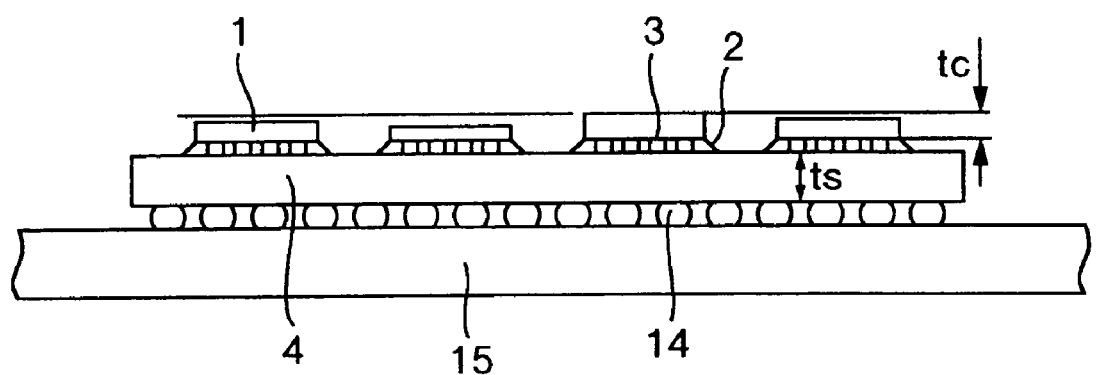
FIG. 17 is a side view of another semiconductor device of the invention.
Figure 18:
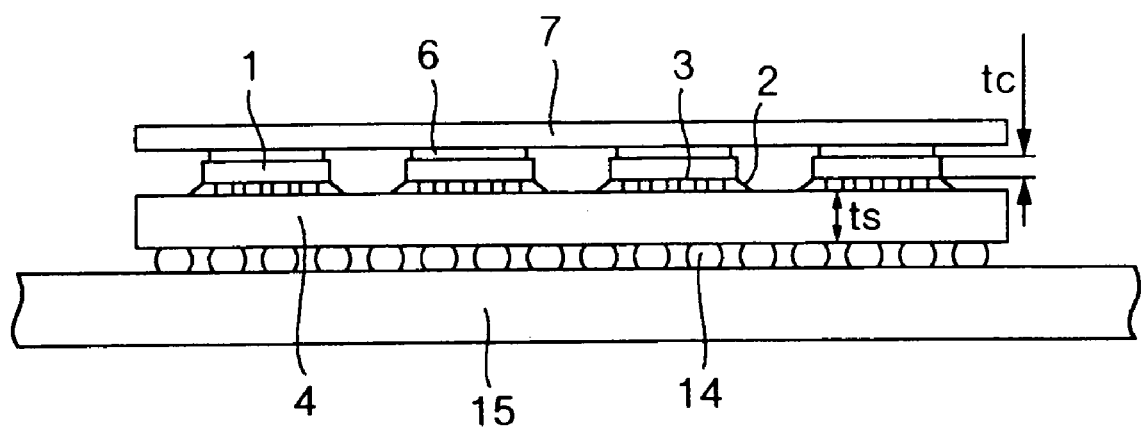
FIG. 18 is a side view of another semiconductor device of the invention.

As shown in FIG. 16, the present invention is effective when the under fills 2 for the semiconductor electric chips 1 adjacent to each other are continuously connected to each other. As shown in FIG. 17, the present invention is effective when the semiconductor electric chips 1 have respective thicknesses different from each other. As shown in FIG. 18, the present invention is effective when a heat radiator plate or light shield plate 7 of metal, for example, stainless steel, is mounted on the semiconductor electric chips 1 through an adhesive 6. A Young's modulus of the adhesive is extremely small in comparison with the Young's modulus of the semiconductor electric chips 1 and the Young's modulus of the substrate, and the heat radiator plate or light shield plate 7 restrains the semiconductor electric chips 1 from being deformed, so that the stress in the semiconductor electric chips 1 is decreased.

Figure 19:
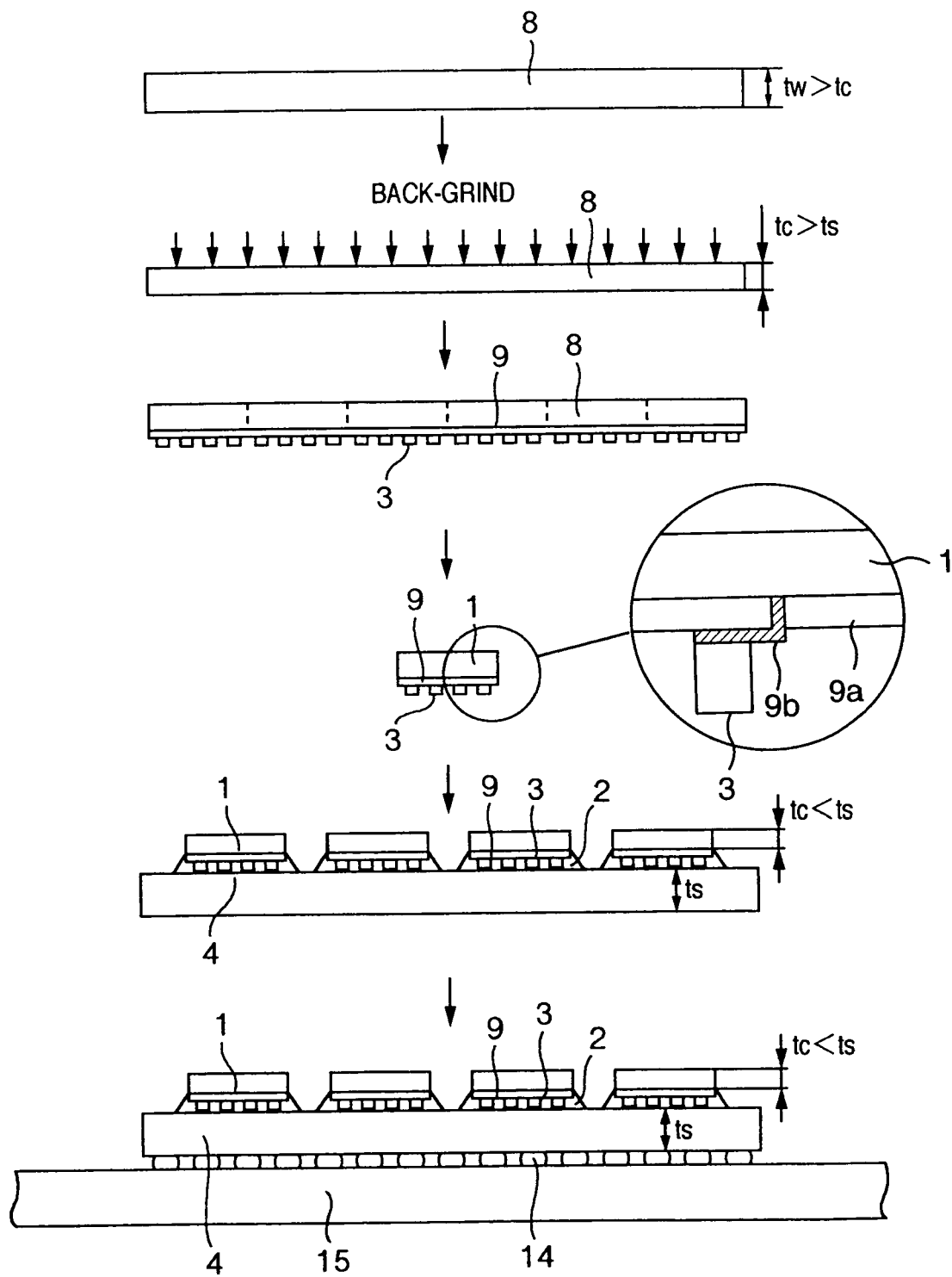
FIG. 19 is a combination of schematic side-views showing respective steps of a method for producing another semiconductor device of the invention.

As shown in FIG. 19, the semiconductor electric chip 1 may include a rewiring layer 9 through which an electric circuit of the semiconductor electric chip 1 is electrically connected to the bumps 3. The rewiring layer 9 has an electrically insulating layer 9a of organic synthetic resin such as polyimide and an electrically conductive wire 9b of CU or the like. The electrically conductive wire 9b extends perpendicularly to a stack direction of the semiconductor electric chip, the substrate and the mother board to enable the bump 3 to be arranged freely with respect to the electric circuit of the semiconductor electric chip 1. The present invention is effective when the rewiring layer 9 is arranged between the under fill 2 and the semiconductor electric chip 1 or between the substrate and the semiconductor electric chip 1. A thickness of the rewiring layer 9 (0.01–0.05 mm) is smaller than the thickness of the semiconductor electric chip 1 so that the stress in the semiconductor electric chip 1 is not changed significantly by the rewiring layer 9.

It should be further understood by those skilled in the art that the foregoing description has been made on embodiments of the invention and that various changes and modifications may be made in the invention without departing from the spirit of the invention and the scope of the appended claims.

What is claimed is:

1. A semiconductor device adapted to be mounted on a board and to be electrically connected to the board, comprising,
    at least two semiconductor chips, and
    a substrate on which the semiconductor chips are mounted and to which the semiconductor chips are electrically connected, in such a manner that the semiconductor chips are mounted on and electrically connected to the board through the substrate,
    wherein a thickness of each of the semiconductor chips in a direction in which the each of the semiconductor chips and the substrate are stacked is smaller than a thickness of the substrate in the direction.

2. A semiconductor device according to claim 1, wherein the semiconductor chips are distant away from each other in a direction perpendicular to the direction.

3. A semiconductor device according to claim 1, further comprising a synthetic resin layer connected to the each of the semiconductor chips and the substrate so that the each of the semiconductor chips is connected to the substrate through the synthetic resin layer.

4. A semiconductor device according to claim 3, further comprising an electrically conductive member through which the each of the semiconductor chips is electrically connected to the substrate, wherein the electrically conductive member is surrounded by the synthetic resin layer.

5. A semiconductor device according to claim 1, wherein the each of the semiconductor chips includes a first surface facing to the substrate and a second surface as a reverse surface with respect to the first surface, and the second surface of at least one of the semiconductor chips is a grinder-finished surface.

6. A semiconductor device according to claim 1, wherein the thickness of the each of the semiconductor chips is not more than 50 a of the thickness of the substrate.

7. A semiconductor device according to claim 1, wherein the thickness of the each of the semiconductor chips is not more than 30% of the thickness of the substrate.

8. A semiconductor device according to claim 1, wherein the substrate includes a first surface on which the semiconductor chips are mounted, and a second surface as a reverse surface in the direction with respect to the first surface, the semiconductor device further comprises an electrically conductive member through which the second surface of the substrate is electrically connected to the board, and the electrically conductive member extends in a width of one of the semiconductor chips as seen in another direction perpendicular to the direction.

9. A semiconductor device according to claim 1, further comprising first electrically conductive members through which one of the semiconductor chips is electrically connected to the substrate, second electrically conductive members through which the substrate is electrically connected to the board, and a synthetic resin layer, wherein the synthetic resin layer joins with the one of the semiconductor chips and the substrate between the first electrically conductive members, and the synthetic resin layer is prevented from joining with the board and the substrate between the second electrically conductive members.

10. A semiconductor device according to claim 8, wherein a Young's modulus of the semiconductor chips is larger than a Young's modulus of the substrate.

11. A semiconductor device according to claim 8, wherein a linear expansion coefficient of the semiconductor chips is smaller than a linear expansion coefficient of the substrate.

12. A semiconductor device according to claim 8, wherein $12 < As\ (\times 10^{-6}K^{-1}) \leqq 20$ and $TC/TS \leqq -0.04AS+1.1$ when a linear expansion coefficient of the substrate under TMA measuring is AS, and a thickness of the each of the semiconductor chips is TC and a thickness of the substrate is TS.

13. A semiconductor device according to claim 8, further comprising a synthetic resin layer connected to one of the semiconductor chips and the substrate so that the one of the semiconductor chips is connected to the substrate through the synthetic resin layer, wherein a Young's modulus of the synthetic resin layer under DMA measuring is not more than 10 GPA, and a linear expansion coefficient of the synthetic resin layer under TMA measuring is not more than $35 \times 10^{-6}K^{-1}$.

14. A semiconductor device according to claim 9, wherein a Young's modulus of the semiconductor chips is larger than a Young's modulus of the substrate.

15. A semiconductor device according to claim 9, wherein a linear expansion coefficient of the semiconductor chips is smaller than a linear expansion coefficient of the substrate.

16. A semiconductor device according to claim 9, wherein $12 < As\ (\times 10^{-6}K^{-1}) \leqq 20$ and $TC/TS \leqq -0.04AS+1.1$ when a linear expansion coefficient of the substrate under TMA measuring is AS, and a thickness of the each of the semiconductor chips is TC and a thickness of the substrate is TS.

17. A semiconductor device according to claim 9, wherein a Young's modulus of the synthetic resin layer under DMA measuring is not more than 10 GPA, and a linear expansion coefficient of the synthetic resin layer under TMA measuring is not more than $35 \times 10^{-6}K^{-1}$.

18. A semiconductor device according to claim 1, wherein a linear expansion coefficient of the substrate is different from a linear expansion coefficient of the board.

19. A semiconductor device according to claim 1, wherein a linear expansion coefficient of the substrate is smaller than a linear expansion coefficient of the board.

20. A semiconductor device according to claim 1, further comprising electrically conductive bumps through which the at least two semiconductor chips are connected to the substrate.

21. A semiconductor device according to claim 20, further comprising additional electrically conductive bumps through which the substrate is connected to the board.

* * * * *